United States Patent
Wang et al.

(10) Patent No.: US 11,463,641 B2
(45) Date of Patent: Oct. 4, 2022

(54) IMAGE SENSOR, MOBILE TERMINAL, AND PHOTOGRAPHING METHOD

(71) Applicant: VIVO MOBILE COMMUNICATION CO., LTD., Guangdong (CN)

(72) Inventors: Danmei Wang, Chang'an Dongguan (CN); Huazhao Zhou, Chang'an Dongguan (CN); Panpan Zhu, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 23 days.

(21) Appl. No.: 17/152,266

(22) Filed: Jan. 19, 2021

(65) Prior Publication Data
US 2021/0144322 A1 May 13, 2021

Related U.S. Application Data

(63) Continuation of application No. PCT/CN2019/094545, filed on Jul. 3, 2019.

(30) Foreign Application Priority Data

Jul. 19, 2018 (CN) .......................... 201810797261.9

(51) Int. Cl.
*H04N 5/369* (2011.01)
*H04N 13/254* (2018.01)
(Continued)

(52) U.S. Cl.
CPC ..... *H04N 5/36965* (2018.08); *H04N 5/36961* (2018.08); *H04N 5/379* (2018.08);
(Continued)

(58) Field of Classification Search
CPC ........... H04N 5/36965; H04N 5/36961; H04N 5/379; H04N 9/045; H04N 13/254;
(Continued)

(56) References Cited

U.S. PATENT DOCUMENTS

2017/0265278 A1* 9/2017 Endo .................... G05D 1/0088
2018/0076258 A1* 3/2018 Hsieh .................. H01L 27/1462
(Continued)

FOREIGN PATENT DOCUMENTS

| CN | 107040724 A | 8/2017 |
| CN | 107968103 A | 4/2018 |

(Continued)

OTHER PUBLICATIONS

Written Opinion and International Search Report dated Jan. 19, 2021 as received in application No. PCT/CN2019/094545.

*Primary Examiner* — Michael E Teitelbaum
(74) *Attorney, Agent, or Firm* — Maschoff Brennan

(57) ABSTRACT

An image sensor, a mobile terminal and a photographing method are provided. The image sensor includes: a pixel array, where the pixel array includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel includes a red subpixel, a green subpixel, and an infrared subpixel, and both the first pixel and the second pixel are dual photodiode pixels, where a location of the blue subpixel in the first pixel is the same as that of the infrared subpixel in the second pixel, and each of the first pixel and the second pixel includes four dual photodiode subpixels.

12 Claims, 6 Drawing Sheets

(51) Int. Cl.
  *H04N 9/04*        (2006.01)
  *H04N 5/372*       (2011.01)
  *H04N 5/374*       (2011.01)

(52) U.S. Cl.
  CPC ........... *H04N 9/045* (2013.01); *H04N 13/254* (2018.05); *H04N 5/372* (2013.01); *H04N 5/374* (2013.01)

(58) Field of Classification Search
  CPC ...... H04N 5/372; H04N 5/374; H04N 5/2254; H04N 5/232122; H04N 13/218; H04N 13/257; H04N 13/271; H04N 9/04553; H04N 5/2253; H04N 5/23212; H04N 5/369; H04N 9/04; H01L 27/14621
  See application file for complete search history.

(56) References Cited

U.S. PATENT DOCUMENTS

2018/0316845 A1* 11/2018 Ouyang .................. G02B 7/346
2021/0144322 A1   5/2021 Wang

FOREIGN PATENT DOCUMENTS

| CN | 207354459 A | 5/2018 |
| CN | 108271012 A | 7/2018 |
| CN | 108900751 A | 11/2018 |
| WO | 2017171412 A2 | 10/2017 |

* cited by examiner

IMAGE SENSOR, MOBILE TERMINAL, AND PHOTOGRAPHING METHOD

CROSS REFERENCE TO RELATED APPLICATIONS

This application is a continuation application of PCT International Application No. PCT/CN2019/094545 filed on Jul. 3, 2019, which claims priority to Chinese Patent Application No. 201810797261.9 filed on Jul. 19, 2018 in China, both disclosures of which are incorporated herein by reference in their entireties.

TECHNICAL FIELD

The present disclosure relates to the field of communications technologies, and in particular, to an image sensor, a mobile terminal, and a photographing method.

BACKGROUND

At present, intelligent electronic products have gradually become a necessity in people's lives, and the photographing function as an important configuration of electronic products is also gradually developed. However, as the photographing function is promoted and popularized, people are no longer satisfied with the existing photographing function of cameras in intelligent electronic products, and desire for diverse photographing effects, entertainment manners, and functions.

Currently, in the market, the Bayer pixel array layout of red (R) green (G) blue (B) is most commonly used for an image sensor based on a complementary metal oxide semiconductor (CMOS), as shown in FIG. 1a. However, in this layout, an object distance cannot be detected, only natural light can be received, and an image is taken and recorded under normal illumination.

The pixel array layout of the dual photodiode (2PD) technology is shown in FIG. 1b and FIG. 1c. In this layout, similarly, only natural light can be received for photographing and recording an image. However, compared with the technical solution of phase detection auto focus (PDAF), this technology can increase the distance from a detected object and can complete a focusing operation more quickly.

The principle of the 2PD phase detection technology is described as follows: As can be seen from FIG. 1b and FIG. 1c, some R, G, and B subpixels in the pixel array are divided into two parts. Light energy obtained from different incident directions is different. Therefore, the left subpixel and the right subpixel constitute a phase detection pair. When luminance values of the left subpixel and the right subpixel both reach a relative peak value, the image is comparatively clearest, that is, focusing is implemented. Then, the object distance is calculated by using an algorithm, to achieve quick focusing.

To sum up, in the pixel array layout of the CMOS image sensor, an object distance cannot be detected and only natural light can be received. Although an object distance can be detected in the pixel array layout of the 2PD technology, only natural light can be received. Therefore, the pixel array layout of the image sensor in the related art has the following problems: photographing scenarios are limited, and focusing is so slow that user's photographing experience is affected.

SUMMARY

Embodiments of the present disclosure provide an image sensor, a mobile terminal, and a photographing method, to resolve the following related-art problems in photographing: photographing scenarios are limited, and focusing is so slow that user's photographing experience is affected.

To resolve the foregoing problems, the embodiments of the present disclosure provide the following implementations:

According to a first aspect, an embodiment of the present disclosure provides an image sensor, including:

a pixel array, where the pixel array includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel includes a red subpixel, a green subpixel, and an infrared subpixel, and both the first pixel and the second pixel are dual photodiode pixels, where a location of the blue subpixel in the first pixel is the same as that of the infrared subpixel in the second pixel, and each of the first pixel and the second pixel includes four dual photodiode subpixels.

According to a second aspect, an embodiment of the present disclosure further provides a mobile terminal, including an imaging system and an infrared transmitting module, where the imaging system includes the foregoing image sensor, and further includes:

a lens module;

a driver module configured to drive the lens module to move;

a filtering module disposed between the lens module and the image sensor;

an image data processing module connected to the image sensor; and a display module connected to the image data processing module.

According to a third aspect, an embodiment of the present disclosure further provides a photographing method, applied to a mobile terminal, where the mobile terminal includes the foregoing image sensor and further includes an infrared transmitting module, and the method includes:

emitting infrared light by using the infrared transmitting module;

obtaining a distance between each infrared light reflection point of a to-be-photographed object and the mobile terminal according to infrared light reflected by the to-be-photographed object; and obtaining three-dimensional information of the to-be-photographed object according to the distance between each infrared light reflection point of the to-be-photographed object and the mobile terminal.

In the technical solutions of the present disclosure, the pixel array layout of the image sensor is improved to replace the RGB pixel array layout with the RGB-IR pixel array layout of 2PD. In this way, the distance between the to-be-photographed object and the mobile terminal can be detected while the infrared light is received for photographing and recording an image. Quick focusing and bokeh are implemented to improve an imaging effect of an image. A related application function of three-dimensional photographing and dark-state imaging are implemented. Features of the mobile terminal are improved while user photographing experience is ensured.

BRIEF DESCRIPTION OF DRAWINGS

The following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

FIG. 3d is a second schematic diagram of a pixel array layout according to an embodiment of the present disclosure;

FIG. 4a is a fourth schematic diagram of a pixel unit according to an embodiment of the present disclosure;

FIG. 4b is a fifth schematic diagram of a pixel unit according to an embodiment of the present disclosure;

FIG. 4c is a sixth schematic diagram of a pixel unit according to an embodiment of the present disclosure;

DESCRIPTION OF EMBODIMENTS

Figures 1A, 1B, 1C:
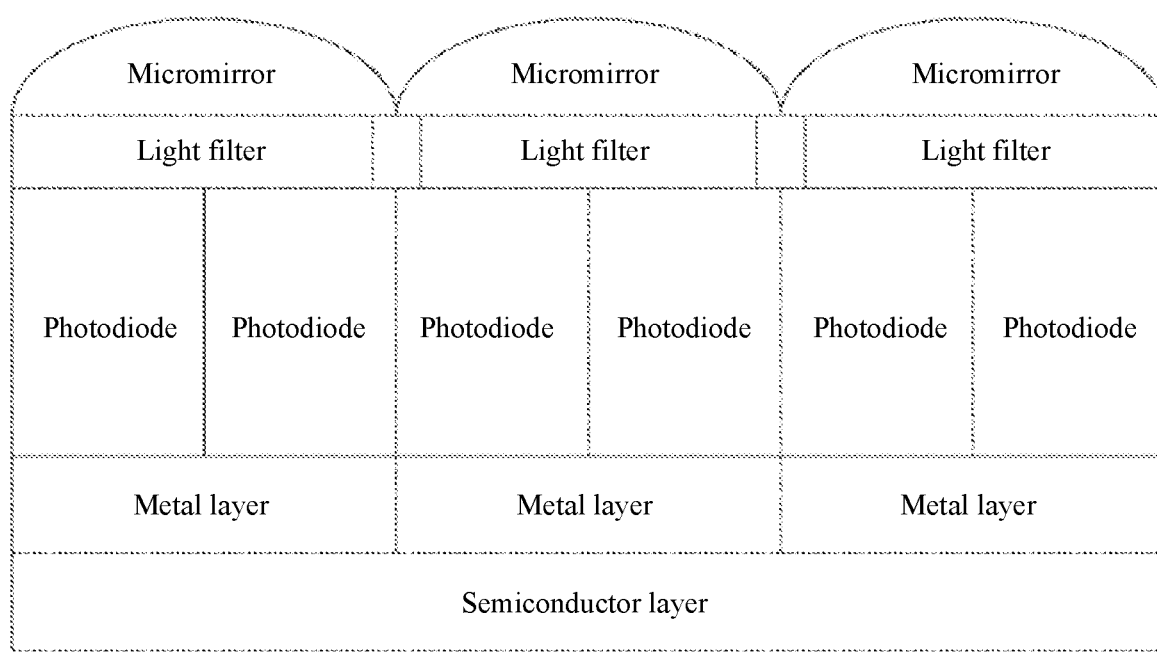
FIG. 1a is a schematic diagram of a conventional RGB layout in the related art.
FIG. 1b is a diagram of a pixel array layout of 2PD.
FIG. 1c is a cross-sectional diagram of pixels of 2PD.

The following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

The embodiments of the present disclosure provide an image sensor. As shown in FIG. 2a, FIG. 3a to FIG. 3d, and FIG. 4a to FIG. 4e, the image sensor includes:

a pixel array, where the pixel array includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel includes a red subpixel, a green subpixel, and an infrared subpixel, and both the first pixel and the second pixel are dual photodiode pixels, where a location of the blue subpixel in the first pixel is the same as that of the infrared subpixel in the second pixel, and each of the first pixel and the second pixel includes four dual photodiode subpixels.

The pixel array included in the image sensor provided in the embodiments of the present disclosure includes the preset quantity of pixel units. The preset quantity of pixel units are arranged in the predetermined manner. The preset quantity of pixel units all include the first pixel and the second pixel adjacent to the first pixel. Subpixels of the first pixel are different from those of the second pixel. The first pixel includes the red subpixel (R), the green subpixel (G), and the blue subpixel (B). The second pixel includes the red subpixel, the green subpixel, and the infrared subpixel (IR). The infrared subpixel is disposed in the second pixel, so that the infrared light can be received for photographing an image. In this way, dark-state imaging is implemented and user photographing experience is ensured.

In the embodiments of the present disclosure, both the first pixel and the second pixel are dual photodiode (2PD) pixels. The 2PD pixels are used so that an object distance can be detected and a focusing operation can be performed more quickly. Each of the first pixel and the second pixel includes four subpixels, and all the four subpixels are 2PD subpixels.

A location of the blue subpixel in the first pixel is the same as that of the infrared subpixel in the second pixel. The following describes specific forms of the first pixel and the second pixel.

The red subpixel, the green subpixel, and the blue subpixel of the first pixel are arranged in a particular manner. The first pixel includes one red subpixel, one blue subpixel, and two green subpixels. For ease of distinguishing herein, the two green subpixels are separately referred to as a first green subpixel and a second green subpixel, and the first green subpixel and the second green subpixel are the same. The red subpixel is adjacent to the first green subpixel, the second green subpixel is below the red subpixel, the blue subpixel is below the first green subpixel, and the second green subpixel is adjacent to the blue subpixel.

The red subpixel, the green subpixel, and the infrared subpixel of the second pixel are arranged in a particular manner. The second pixel includes one red subpixel, one infrared subpixel, and two green subpixels. For ease of distinguishing herein, the two green subpixels are separately referred to as a first green subpixel and a second green subpixel, and the first green subpixel and the second green subpixel are the same. The red subpixel is adjacent to the first green subpixel, the second green subpixel is below the red subpixel, the infrared subpixel is below the first green subpixel, and the second green subpixel is adjacent to the infrared subpixel.

In the embodiments of the present disclosure, the RGB pixel array layout is improved to replace the RGB pixel array layout with the red green blue infrared (RGB-IR) pixel array layout, so that the mobile terminal can receive the infrared light for photographing an image. In this way, dark-state imaging is implemented and user photographing experience is ensured.

In addition, the image sensor in the embodiments of the present disclosure can detect the distance between the to-be-photographed object and the mobile terminal. Quick focusing and bokeh are implemented, and an imaging effect of an image can be improved through cooperation with the infrared transmitting module. A related application function of three-dimensional photographing is implemented. Features of the mobile terminal are improved while user photographing experience is ensured.

In the embodiments of the present disclosure, as shown in FIG. 2a, FIG. 3a to FIG. 3d, and FIG. 4a to FIG. 4e, the pixel unit includes one second pixel and at least one first pixel.

In the pixel array provided in the embodiments of the present disclosure, each pixel unit includes one second pixel and at least one first pixel. The following describes examples of specific forms of the first pixel and the second pixel included in the pixel unit.

Figures 2A, 2B, 3A, 3B, 3C:
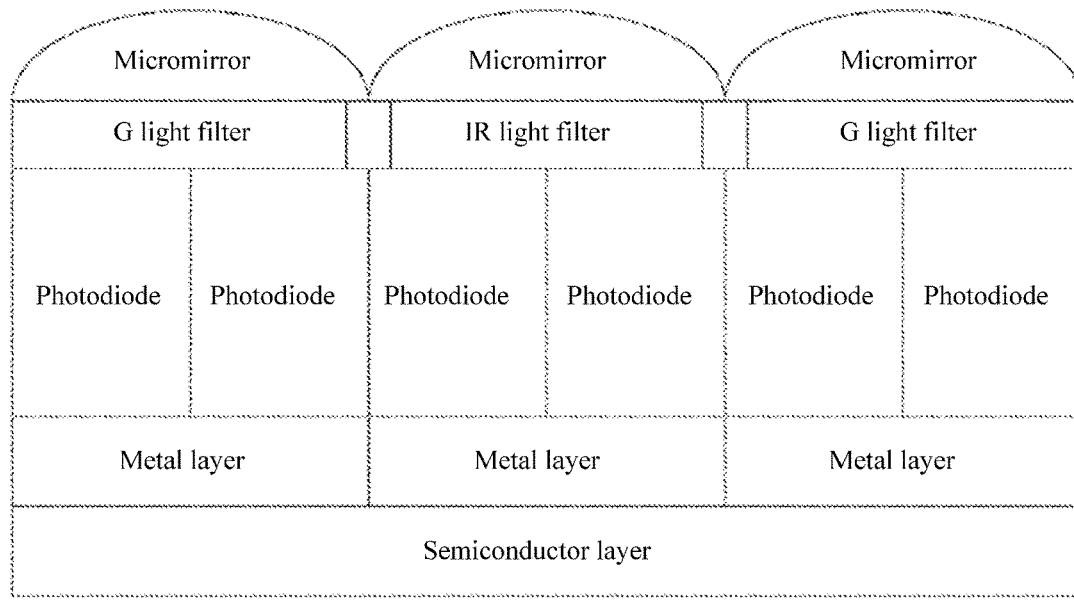
FIG. 2a is a first schematic diagram of a pixel array layout according to an embodiment of the present disclosure.
FIG. 2b is a cross-sectional diagram of pixels according to an embodiment of the present disclosure.
FIG. 3a is a first schematic diagram of a pixel unit according to an embodiment of the present disclosure.
FIG. 3b is a second schematic diagram of a pixel unit according to an embodiment of the present disclosure.
FIG. 3c is a third schematic diagram of a pixel unit according to an embodiment of the present disclosure.

As shown in FIG. 2a, when the pixel unit includes one first pixel and one second pixel, the density of the infrared subpixel in the pixel unit is ⅛. The pixel array shown in FIG. 2a includes 8 pixel units, and each pixel unit includes one first pixel and one second pixel. In this case, the second pixel includes two green subpixels, one red subpixel, and one infrared subpixel, that is, the infrared subpixel replaces the blue subpixel of the first pixel.

A location of the infrared subpixel (a location of the second pixel) in the pixel unit is not specifically limited. In the pixel unit, the first pixel and the second pixel may be sequentially arranged, or the second pixel and the first pixel may be sequentially arranged. The first pixel and the second pixel form the pixel unit, and the formed pixel units are combined to form the pixel array shown in FIG. 2a. In the pixel array shown in FIG. 2a, the first pixel and the second pixel in the pixel unit may be arranged in different manners, that is, locations of the second pixels may be different. The pixel array shown in FIG. 2a is only an example for illustration, and a person skilled in the art can further make appropriate changes.

In the current state, the pixel unit corresponds to two types: a first pixel unit and a second pixel unit. In the first pixel unit, the first pixel and the second pixel are arranged along a first direction. In the second pixel unit, the second pixel and the first pixel are arranged along the first direction. Two first pixel units that are completely the same are arranged along the first direction, two second pixel units that are completely the same are arranged along the first direction, and the first pixel unit, the second pixel unit, the first pixel unit, and the second pixel unit are sequentially arranged along a second direction, to form the pixel array shown in FIG. 2a. The first direction is perpendicular to the second direction.

As shown in FIG. 3a to FIG. 3c, when the pixel unit includes two first pixels and one second pixel, the density of the infrared subpixel in the pixel unit is 1/12. A location of the infrared subpixel (a location of the second pixel) in the pixel unit is not specifically limited. In FIG. 3a, two first pixels and one second pixel are sequentially arranged, and the second pixel is located on the right side of the pixel unit. In FIG. 3b, the first pixel, the second pixel, and the first pixel are sequentially arranged, and the second pixel is located in the middle of the pixel unit. In FIG. 3c, the second pixel and two first pixels are sequentially arranged, and the second pixel is located on the left side of the pixel unit. The pixel units shown in FIG. 3a, FIG. 3b, and FIG. 3c may be combined to form the pixel array.

In the current state, the pixel unit shown in FIG. 3a is a third pixel unit, the pixel unit shown in FIG. 3b is a fourth pixel unit, and the pixel unit shown in FIG. 3c is a fifth pixel unit.

Figures 3D, 4A, 4B, 4C:
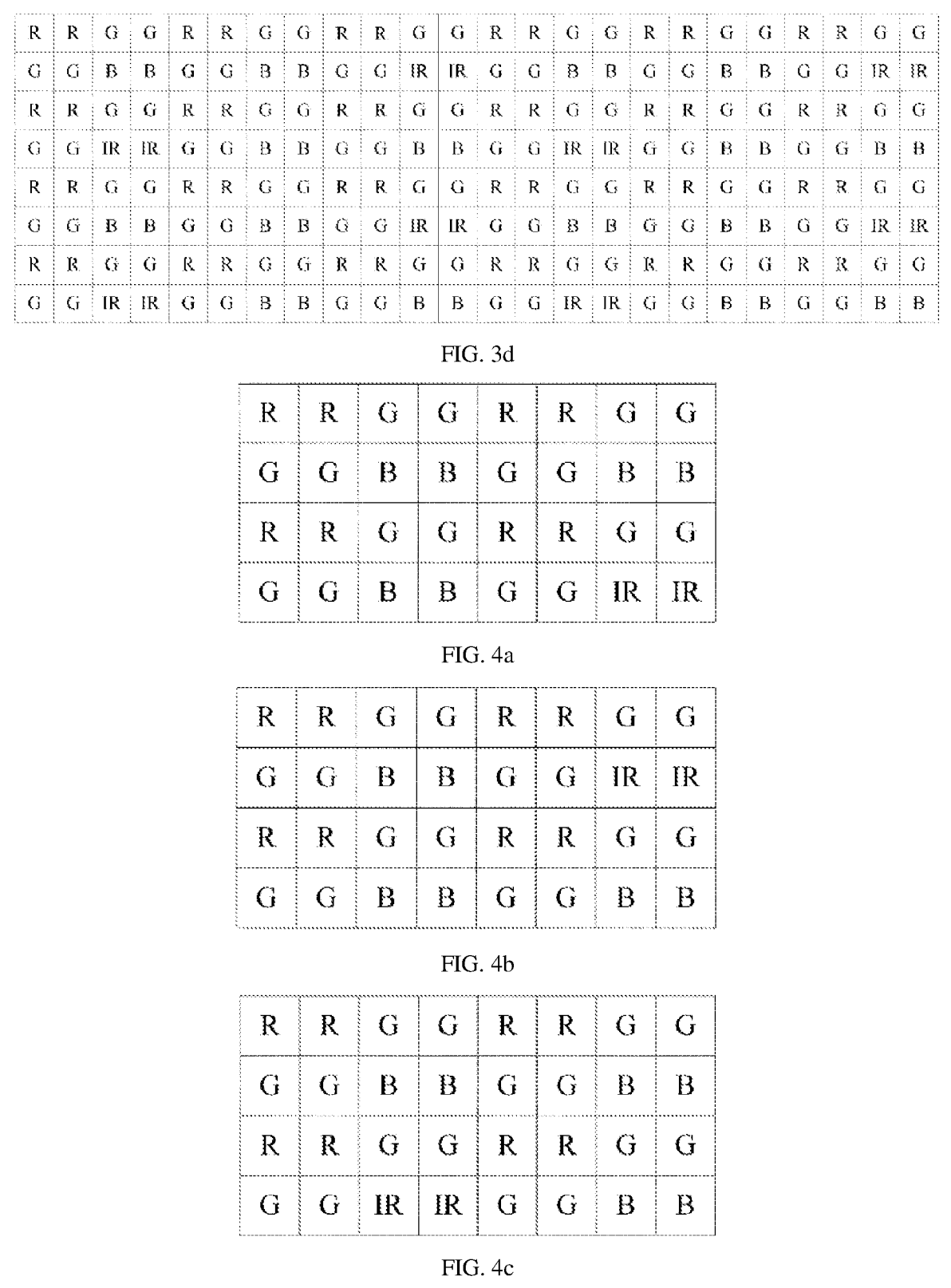

The pixel array shown in FIG. 3d includes 8 pixel units. Two third pixel units that are completely the same are arranged along the first direction, two fifth pixel units that are completely the same are arranged along the first direction, and the third pixel unit, the fifth pixel unit, the third pixel unit, and the fifth pixel unit are sequentially arranged along a second direction. The first direction is perpendicular to the second direction. The pixel array layout shown in FIG. 3d is only an example for illustration. When the pixel unit includes two first pixels and one second pixel, the present disclosure further includes a plurality of pixel array layouts, which are not listed herein one by one.

Figures 4D, 4E, 5A:
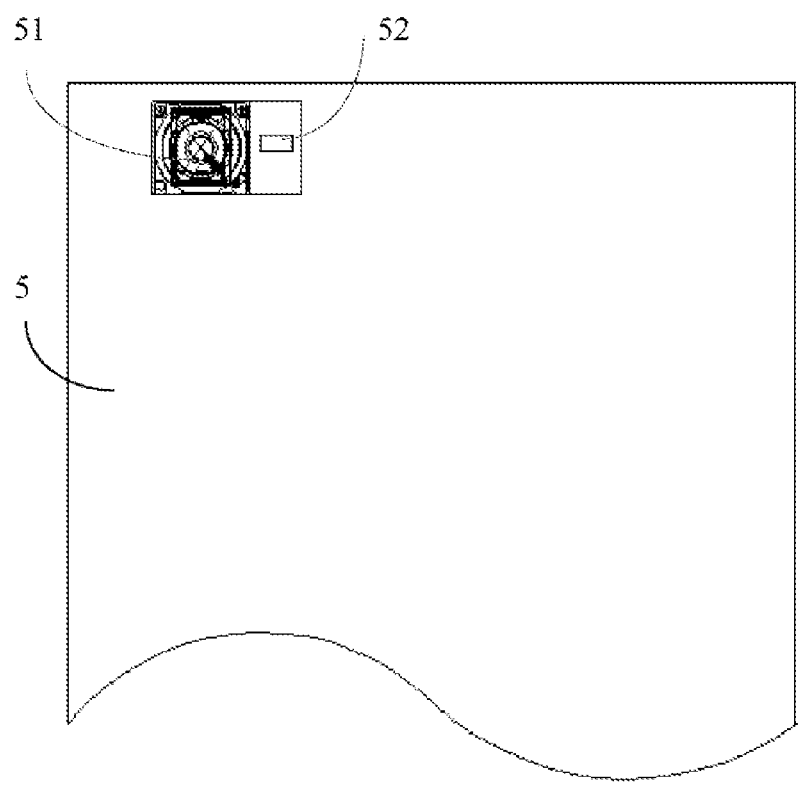
FIG. 4d is a seventh schematic diagram of a pixel unit according to an embodiment of the present disclosure.
FIG. 4e is a third schematic diagram of a pixel array layout according to an embodiment of the present disclosure.
FIG. 5a is a schematic diagram of a mobile terminal according to an embodiment of the present disclosure.

As shown in FIG. 4a, when the pixel unit includes three first pixels and one second pixel, the density of the infrared subpixel in the pixel unit is 1/16. A location of the infrared subpixel (a location of the second pixel) in the pixel unit is not limited. In this case, in FIG. 4a, two first pixels are sequentially arranged at an upper layer, and the remaining first pixel and one second pixel are sequentially arranged at a lower layer, where the second pixel is located at a lower right position of the pixel unit. In FIG. 4b, the first pixel and the second pixel are sequentially arranged at an upper layer, and two first pixels are sequentially arranged at a lower layer, where the second pixel is located at an upper right position of the pixel unit. In FIG. 4c, two first pixels are sequentially arranged at an upper layer, and the second pixel and one first pixel are sequentially arranged at a lower layer, where the second pixel is located at a lower left position of the pixel unit. In FIG. 4d, the second pixel and the first pixel are sequentially arranged at an upper layer, and two first pixels are sequentially arranged at a lower layer, where the second pixel is located at an upper left position of the pixel unit.

In the current state, the pixel unit corresponds to four types: a sixth pixel unit, a seventh pixel unit, an eighth pixel unit, and a ninth pixel unit. FIG. 4a shows the sixth pixel unit, FIG. 4b shows the seventh pixel unit, FIG. 4c shows the eighth pixel unit, and FIG. 4d shows the ninth pixel unit.

The pixel array shown in FIG. 4e includes 6 pixel units. The sixth pixel unit, the seventh pixel unit, and the sixth pixel unit are arranged along the first direction, the eighth pixel unit, the ninth pixel unit, and the eighth pixel unit are arranged along the first direction, the eighth pixel unit is below the sixth pixel unit, and the ninth pixel unit is below the seventh pixel unit. The pixel array layout shown in FIG. 4e is only an example for illustration. When the pixel unit includes three first pixels and one second pixel, the present disclosure further includes a plurality of pixel array layouts, which are not listed herein one by one.

In the embodiments of the present disclosure, the pixel unit is not limited to this form, and the location of the infrared subpixel (the location of the second pixel) in the pixel unit is not limited herein. The density of the infrared subpixel in the pixel unit is ¼n, where n is an integer greater than or equal to 2. The pixel array may be formed as follows: using an RGB+IR pixel unit with the density of ⅛, an RGB+IR pixel unit with the density of 1/12, or an RGB+IR pixel unit with the density of 1/16 as a pixel unit array, and periodically arranging pixel unit arrays to form the pixel array. Certainly, the pixel array may also be in another form. Examples are not listed herein, In addition, the size of the pixel array to which the infrared subpixel is applied is not limited.

In the embodiments of the present disclosure, the red subpixel includes a semiconductor layer, a metal layer, a photodiode, a red light filter, and a micromirror that are sequentially stacked; the green subpixel includes a semiconductor layer, a metal layer, a photodiode, a green light filter, and a micromirror that are sequentially stacked; the blue subpixel includes a semiconductor layer, a metal layer, a photodiode, a blue light filter, and a micromirror that are sequentially stacked; and the infrared subpixel includes a semiconductor layer, a metal layer, a photodiode, an infrared cut-off filter, and a micromirror that are sequentially stacked.

The semiconductor layer, the metal layer, the photodiode, the red light filter, and the micromirror included in the red subpixel are sequentially arranged from bottom to top. Correspondingly, the semiconductor layer, the metal layer, the photodiode, the green light filter, and the micromirror included in the green subpixel are sequentially arranged from bottom to top. The semiconductor layer, the metal layer, the photodiode, the blue light filter, and the micromirror included in the blue subpixel are sequentially arranged from bottom to top. The semiconductor layer herein may be a silicon substrate, but is not limited thereto. Structural forms of the green subpixel and the infrared subpixel may be shown in FIG. 2b. The difference between structural forms of the subpixels is that the light filters are different. As shown in FIG. 2b, the green light filter may be replaced by the red light filter or the blue light filter to obtain the structure of the red subpixel and the blue subpixel.

The red light filter, the green light filter, and the blue light filter are used to obtain color information of pixels in a composite image, and block the entry of an infrared ray, for example, allow only visible light with a wavelength from 380 nm to 700 nm to enter. An image with complete and vivid colors can be directly generated under high luminance The semiconductor layer, the metal layer, the photodiode, the infrared cut-off filter, and the micromirror included in the infrared subpixel are sequentially arranged from bottom to top. A photosensitive bandwidth of the infrared subpixel is from 750 nm to 1100 nm. In this case, a formed infrared filter area may allow an infrared band to pass through. This can not only improve the dark-state imaging effect, but also implement an infrared ranging function.

As can be seen from the foregoing descriptions, the RGB subpixels are light receiving elements corresponding to wavelength light of RGB colors, and the IR subpixel is a light receiving element corresponding to infrared light.

In the embodiments of the present disclosure, the image sensor is a complementary metal oxide semiconductor CMOS image sensor, a charge coupled device (CCD) image sensor, or a quantum thin-film image sensor.

In the present disclosure, types of image sensors to which the RGB-IR pixel array layout is applied are not limited, and may be a CMOS-based image sensor, a CCD-based image sensor, or an image sensor based on a quantum thin-film, and certainly may also be other types of image sensors. In addition, the image sensor in the embodiments of the present disclosure may be applied to any electronic product including a camera module.

In the image sensor provided in the embodiments of the present disclosure, the pixel array layout of the image sensor is improved to replace the RGB pixel array layout with the RGB-IR pixel array layout of 2PD. In this way, the distance between the to-be-photographed object and the mobile terminal can be detected while the infrared light is received for photographing and recording an image. Quick focusing and bokeh are implemented to improve an imaging effect of an image. A related application function of three-dimensional photographing and dark-state imaging are implemented. Features of the mobile terminal are improved while user photographing experience is ensured.

Figure 5B:
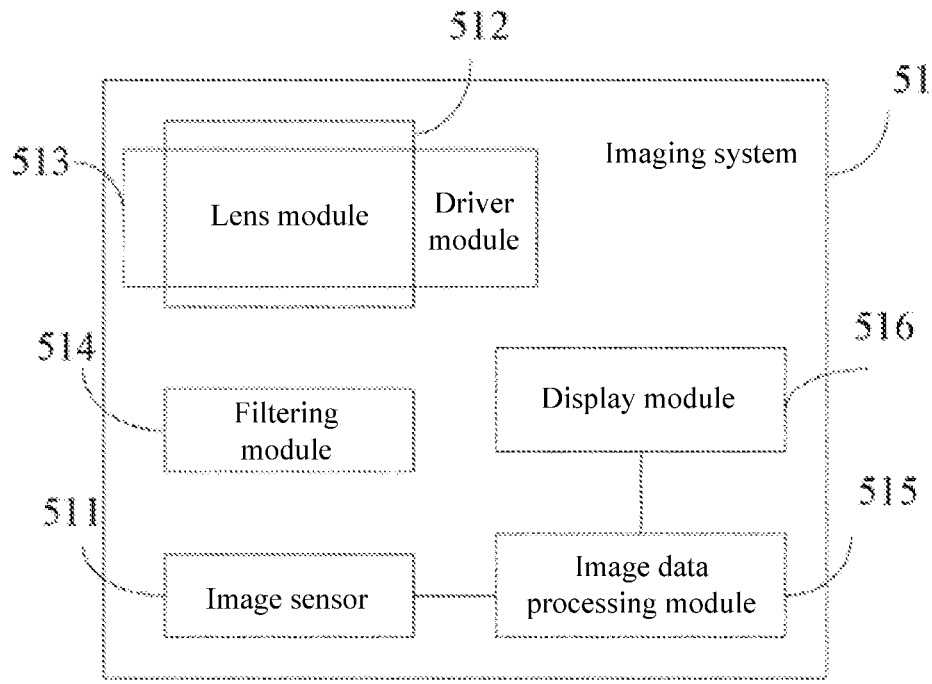
FIG. 5b is a schematic diagram of an imaging system according to an embodiment of the present disclosure.

The embodiments of the present disclosure further provide a mobile terminal, as shown in FIG. 5a and FIG. 5b, including an imaging system 51 and an infrared transmitting module 52. The imaging system 51 includes an image sensor 511, and further includes: a lens module 512, a driver module 513 configured to drive the lens module 512 to move, a filtering module 514 disposed between the lens module 512 and the image sensor 511, an image data processing module 515 connected to the image sensor 511, and a display module 516 connected to the image data processing module 515.

In the embodiments of the present disclosure, the mobile terminal 5 includes the imaging system 51, and further includes the infrared transmitting module 52. The imaging system 51 includes the image sensor 511, and further includes the lens module 512 configured to converge light rays. The lens module 512 is connected to the driver module 513, and the driver module 513 is configured to adjust a location of the lens module 512 depending on a distance from the to-be-photographed object.

The filtering module 514 is disposed between the lens module 512 and the image sensor 511. After being converged by the lens module 512 and passing through the filtering module 514, light rays may be converged on the pixel array of the image sensor 511. The image sensor 511 is connected to the image data processing module 515, and the image data processing module 515 is connected to the display module 516. After the light rays are converged on the pixel array of the image sensor 511, the image sensor 511 performs optical-to-electrical conversion, and then transmits data to the image data processing module 515. The image data processing module 515 processes the data and then displays the processed data in an image form on the display module 516.

After the driver module 513 adjusts the location of the lens module 512, a 2PD pixel in the image sensor 511 may be used to obtain a phase difference, to obtain a distance between an object and an imaging surface, thereby implementing quick focusing.

In addition, the RGB+IR pixel array layout based on the 2PD image sensor in the present disclosure can cooperate with the infrared transmitting module 52 to implement a related three-dimensional function, for example, face recognition unlocking, secure payment, three-dimensional imaging, and other terminal applications, to improve features of the mobile terminal while ensuring imaging.

The filtering module 514 in the embodiments of the present disclosure may allow an optical wavelength from 380 nm to 1100 nm to pass through. In this case, after being converged by the lens module 512, light rays may be filtered by the filtering module 514. The filtering module 514 may allow natural light and infrared light to pass through, and can be used to ensure the imaging effect of the imaging system 51.

The infrared transmitting module 52 of the mobile terminal is disposed on the periphery of the lens module 512. The infrared transmitting module 52 emits an infrared ray. The infrared ray is reflected after encountering an obstacle. After the imaging system 51 captures the reflected infrared lay, the infrared subpixel is used to perform optical-to-electrical conversion, to obtain a time difference between sending the infrared ray and receiving the infrared ray. Because a propagation speed of light is fixed, the distance between the obstacle and the mobile terminal can be calculated. Finally, the distance between each tiny unit on the obstacle and the mobile terminal can be obtained, to implement a stereoscopic imaging recording function. Certainly, the distance between each infrared light reflection point of the obstacle and the mobile terminal may be alternatively obtained by obtaining a phase difference of the infrared light.

In the mobile terminal in the embodiments of the present disclosure, the pixel array layout of the image sensor is improved to replace the RGB pixel array layout with the RGB-IR pixel array layout of 2PD. In this way, the distance between the to-be-photographed object and the mobile terminal can be detected while the infrared light is received for photographing and recording an image. Quick focusing and bokeh are implemented to improve an imaging effect of an image. A related application function of three-dimensional photographing and dark-state imaging are implemented. Diverse features of the mobile terminal are ensured while user photographing experience is ensured.

Figure 6:
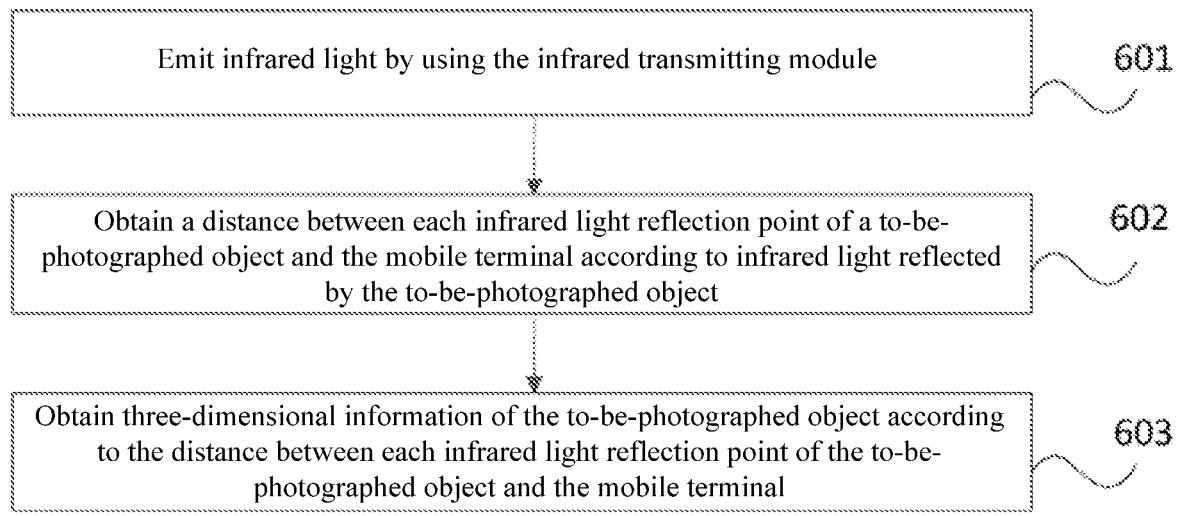
FIG. 6 is a schematic diagram of a photographing method according to an embodiment of the present disclosure.

An embodiment of the present disclosure further provides a photographing method, applied to a mobile terminal. The mobile terminal includes the foregoing image sensor and further includes an infrared transmitting module. As shown in FIG. 6, the method includes:

Step 601: Emit infrared light by using the infrared transmitting module.

The infrared transmitting module on the mobile terminal can emit an infrared ray. The infrared ray is reflected when encountering a to-be-photographed object, and the reflected infrared light is received by the imaging system of the mobile terminal. Because the image sensor of the mobile terminal forms the RGB-IR pixel array, the infrared subpixel may be used to perform optical-to-electrical conversion.

Step 602: Obtain a distance between each infrared light reflection point of a to-be-photographed object and the mobile terminal according to infrared light reflected by the to-be-photographed object.

In obtaining the distance between the to-be-photographed object and the mobile terminal, the distance between the to-be-photographed object and an imaging surface is actually obtained. A process of obtaining the distance between each infrared light reflection point of the to-be-photographed object and the mobile terminal is: receiving, by using the pixel array including the second pixel, infrared light reflected by each infrared light reflection point of the to-be-photographed object; and obtaining the distance between each infrared light reflection point of the to-be-photographed object and the mobile terminal according to a time difference between sending the infrared light and receiving the infrared light and a propagation speed of the infrared light or an obtained phase difference of the infrared light.

After the reflected infrared lay is captured, the infrared subpixel is used to perform optical-to-electrical conversion, to obtain a time difference between sending the infrared ray and receiving the infrared ray. Because a propagation speed of light is fixed, the distance between the obstacle and the mobile terminal can be calculated based on half the product of the time difference and the propagation speed. Time points at which the mobile terminal receives the infrared light reflected by infrared light reflection points are different. A distance can be correspondingly calculated for each infrared light reflection point, and then the distance between each infrared light reflection point and the mobile terminal can be obtained. The distance between each infrared light reflection point and the mobile terminal can be alternatively obtained by obtaining the phase difference of the infrared light. In obtaining the distance between each infrared light reflection point and the mobile terminal by obtaining the phase difference of the infrared light, refer to the time of flight (TOF) technology. Details are not described herein.

The pixel array of the image sensor in the embodiments of the present disclosure includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel includes a red subpixel, a green subpixel, and an infrared subpixel, and both the first pixel and the second pixel are dual photodiode pixels, where a location of the blue subpixel in the first pixel is the same as that of the infrared subpixel in the second pixel, and each of the first pixel and the second pixel includes four dual photodiode subpixels.

Step 603: Obtain three-dimensional information of the to-be-photographed object according to the distance between each infrared light reflection point of the to-be-photographed object and the mobile terminal.

In obtaining the distance between the to-be-photographed object and the mobile terminal, the distance between each tiny unit of the to-be-photographed object and the mobile terminal is specifically obtained, and then the process of photographing the to-be-photographed object is performed to implement the stereoscopic imaging recording function.

In the photographing method in the embodiments of the present disclosure, the pixel array layout of the image sensor may be improved to replace the RGB pixel array layout with the RGB-IR pixel array layout of 2PD. In this way, the distance between the to-be-photographed object and the mobile terminal can be detected while the infrared light is received for photographing and recording an image. Quick focusing and bokeh are implemented to improve an imaging effect of an image. A related application function of three-dimensional photographing and dark-state imaging are implemented. Features of the mobile terminal are improved while user photographing experience is ensured.

Figure 7:
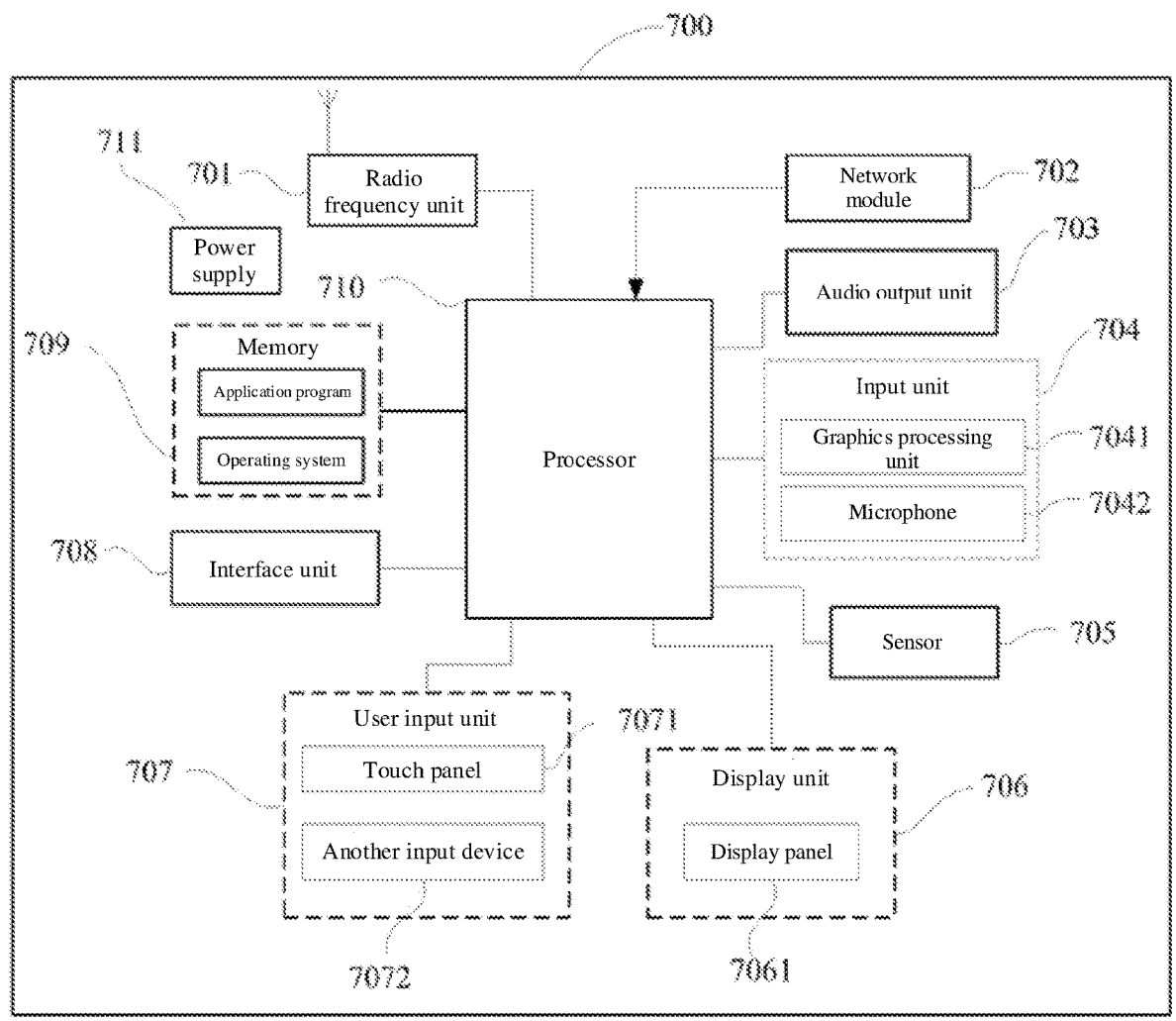
FIG. 7 is a schematic diagram of a hardware structure of a mobile terminal according to an embodiment of the present disclosure.

FIG. 7 is a schematic diagram of a hardware structure of a mobile terminal implementing embodiments of the present disclosure. The mobile terminal 700 includes, but is not limited to, a radio frequency unit 701, a network module 702, an audio output unit 703, an input unit 704, a sensor 705, a display unit 706, a user input unit 707, an interface unit 708, a memory 709, a processor 710, a power supply 711, and other components.

The mobile terminal 700 further includes an imaging system and an infrared transmitting module. The imaging system includes an image sensor, a lens module, a driver module configured to drive the lens module to move, a filtering module disposed between the lens module and the image sensor, an image data processing module connected to the image sensor, and a display module connected to the image data processing module.

The filtering module may allow an optical wavelength from 380 nm to 1100 nm to pass through. The infrared transmitting module is disposed on the periphery of the lens module.

The image sensor includes: a pixel array, where the pixel array includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel includes a red subpixel, a green subpixel, and an infrared subpixel, and both the first pixel and the second pixel are dual photodiode pixels, where a location of the blue subpixel in the first pixel is the same as that of the infrared subpixel in the second pixel, and each of the first pixel and the second pixel includes four dual photodiode subpixels.

The pixel unit includes one second pixel and at least one first pixel.

The red subpixel includes a semiconductor layer, a metal layer, a photodiode, a red light filter, and a micromirror that are sequentially stacked; the green subpixel includes a semiconductor layer, a metal layer, a photodiode, a green light filter, and a micromirror that are sequentially stacked; the blue subpixel includes a semiconductor layer, a metal layer, a photodiode, a blue light filter, and a micromirror that are sequentially stacked; and the infrared subpixel includes a semiconductor layer, a metal layer, a photodiode, an infrared cut-off filter, and a micromirror that are sequentially stacked.

The image sensor is a complementary metal oxide semiconductor CMOS image sensor, a charge coupled device CCD image sensor, or a quantum thin-film image sensor.

A person skilled in the art may understand that a structure of the mobile terminal shown in FIG. 7 constitutes no limitation on the mobile terminal, and the mobile terminal may include more or fewer components than those shown in the figure, or combine some components, or have different component arrangements. In the embodiments of the present disclosure, the mobile terminal includes, but is not limited to, a mobile phone, a tablet computer, a laptop computer, a palmtop computer, an in-vehicle terminal, a wearable device, a pedometer, and the like.

The processor 710 is configured to: emit infrared light by using the infrared transmitting module; obtain a distance between each infrared light reflection point of a to-be-photographed object and the mobile terminal according to infrared light reflected by a to-be-photographed object; and obtain three-dimensional information of the to-be-photographed object according to the distance between each infrared light reflection point of the to-be-photographed object and the mobile terminal.

When obtaining the distance between each infrared light reflection point of the to-be-photographed object and the mobile terminal according to the infrared light reflected by the to-be-photographed object, the processor 710 is configured to: receive, by using the pixel array including the second pixel, infrared light reflected by each infrared light reflection point of the to-be-photographed object; and obtain the distance between each infrared light reflection point of the to-be-photographed object and the mobile terminal according to a time difference between sending the infrared light and receiving the infrared light and a propagation speed of the infrared light or an obtained phase difference of the infrared light.

In this way, the pixel array layout of the image sensor is improved to replace the RGB pixel array layout with the RGB-IR pixel array layout of 2PD. In this way, the distance between the to-be-photographed object and the mobile terminal can be detected while the infrared light is received for photographing and recording an image. Quick focusing and bokeh are implemented to improve an imaging effect of an image. A related application function of three-dimensional photographing and dark-state imaging are implemented. Features of the mobile terminal are improved while user photographing experience is ensured.

It should be understood that in the embodiments of the present disclosure, the radio frequency unit 701 may be configured to receive and send signals in a process of receiving and sending information or calling. Specifically, the radio frequency unit 701 receives downlink data from a base station for processing by the processor 710, and sends uplink data to the base station. Generally, the radio frequency unit 701 includes, but is not limited to, an antenna, at least one amplifier, a transceiver, a coupler, a low noise amplifier, a duplexer, and the like. In addition, the radio frequency unit 701 may also communicate with another device through a wireless communications system and network.

The mobile terminal provides wireless broadband Internet access for a user by using the network module 702, for example, helps the user send and receive an email, browse a web page, and access streaming media.

The audio output unit 703 may convert audio data received by the radio frequency unit 701 or the network module 702 or stored in the memory 709 into an audio signal and output the audio signal as sound. Moreover, the audio output unit 703 may further provide audio output (for example, call signal receiving sound and message receiving sound) related to a specific function performed by the mobile terminal 700. The audio output unit 703 includes a speaker, a buzzer, a telephone receiver, and the like.

The input unit 704 is configured to receive an audio signal or a video signal. The input unit 704 may include a graphics processing unit (GPU) 7041 and a microphone 7042. The graphics processing unit 7041 processes image data of a static picture or a video obtained by an image capturing apparatus (for example, a camera) in a video capturing mode or an image capturing mode. A processed image frame can be displayed on the display unit 706. The display unit herein is the foregoing display module. The image frame processed by the graphics processing unit 7041 can be stored in the memory 709 (or another storage medium) or sent by the radio frequency unit 701 or the network module 702. The graphics processing unit 7041 is the image data processing module. The microphone 7042 may receive sound and can process such sound into audio data. The processed audio data can be converted, in a telephone call mode, into a format that can be sent by the radio frequency unit 701 to a mobile communications base station for output.

The mobile terminal 700 further includes at least one sensor 705, such as a light sensor and a motion sensor. Specifically, the light sensor includes an ambient light sensor and a proximity sensor. The ambient light sensor may adjust luminance of the display panel 7061 based on brightness of ambient light, and the proximity sensor may turn off the display panel 7061 and/or backlight when the mobile terminal 700 approaches an ear. As a type of motion sensor, an accelerometer sensor may detect magnitude of an acceleration in each direction (generally three axes), and may detect magnitude and a direction of gravity when being static. The accelerometer sensor may be configured to recognize a mobile terminal gesture (for example, switching between a portrait mode and a landscape mode, a related game, or magnetometer posture calibration), perform a function related to vibration recognition (for example, a pedometer or a strike), or the like. The sensor 705 may further include a fingerprint sensor, a pressure sensor, an iris sensor, a molecular sensor, a gyroscope, a barometer, a hygrometer, a thermometer, an infrared sensor, and the like. This is not described herein again.

The display unit 706 is configured to display information entered by the user or information provided for the user. The display unit 706 may include the display panel 7061, and the display panel 7061 may be configured in a form of a liquid crystal display (LCD), an organic light-emitting diode (OLED), or the like.

The user input unit 707 may be configured to receive inputted digit or character information and generate key signal input related to user setting and function control of the mobile terminal. Specifically, the user input unit 707 includes a touch panel 7071 and another input device 7072. The touch panel 7071, also referred to as a touch screen, may collect a touch operation of the user on or near the touch panel 7071 (for example, an operation performed by the user with any suitable object or accessory such as a finger or a stylus on or near the touch panel 7071). The touch panel 7071 may include two parts: a touch detection apparatus and a touch controller. The touch detection apparatus detects a touch position of the user, detects a signal brought by the touch operation, and sends the signal to the touch controller. The touch controller receives touch information from the touch detection apparatus, converts the touch information into touch point coordinates, sends the touch point coordinates to a processor 710, and receives and executes a command sent by the processor 710. In addition, the touch panel 7071 may be implemented by using a plurality of types such as a resistive type, a capacitive type, an infrared ray, and a surface acoustic wave. In addition to the touch panel 7071, the user input unit 707 may further include the another input device 7072. Specifically, the another input device 7072 may include, but is not limited to, a physical keyboard, a function key (such as a volume control key or an on/off key), a trackball, a mouse, and a joystick. Details are not described herein again.

Further, the touch panel 7071 may cover the display panel 7061. When the touch panel 7071 detects a touch operation on or near the touch panel 7071, the touch operation is transmitted to the processor 710 to determine a type of a touch event, and then the processor 710 provides corresponding visual output on the display panel 7061 according to the type of the touch event. In FIG. 7, the touch panel 7071 and the display panel 7061 are used as two independent components to implement input and output functions of the mobile terminal. However, in some embodiments, the touch panel 7071 and the display panel 7061 may be integrated to implement the input and output functions of the mobile terminal. This is not specifically limited herein.

The interface unit 708 is an interface connecting an external apparatus to the mobile terminal 700. For example, the external apparatus may include a wired or wireless headphone port, an external power supply (or a battery charger) port, a wired or wireless data port, a storage card port, a port used to connect to an apparatus having an identification module, an audio input/output (Input/Output, I/O) port, a video I/O port, and an earphone port. The interface unit 708 may be configured to receive input (for example, data information and power) from the external apparatus and transmit the received input to one or more elements in the mobile terminal 700, or may be configured to transmit data between the mobile terminal 700 and the external apparatus.

The memory 709 may be configured to store a software program and various data. The memory 709 may mainly include a program storage area and a data storage area. The program storage area may store an operating system, an application program required by at least one function (such as a sound play function or an image display function), and the like. The data storage area may store data (such as audio data or an address book) created based on use of the mobile phone, and the like. In addition, the memory 709 may include a high-speed random access memory, and may further include a non-volatile memory such as at least one magnetic disk storage component, a flash memory component, or another volatile solid-state storage component.

The processor 710 is a control center of the mobile terminal, and is connected to all parts of the entire mobile terminal by using various interfaces and lines, and performs various functions of the mobile terminal and processes data by running or executing the software program and/or the module that are stored in the memory 709 and invoking the data stored in the memory 709, to implement overall monitoring on the mobile terminal. The processor 710 may include one or more processing units. Optionally, the processor 710 may integrate an application processor and a modem processor. The application processor mainly deals with an operating system, a user interface, and an application program. The modem processor mainly deals with wireless communication. It may be understood that the modem processor may not be integrated into the processor 710.

The mobile terminal 700 may further include a power supply 711 (such as a battery) that supplies power to each component. Optionally, the power supply 711 may be logically connected to the processor 710 by using a power supply management system, to implement functions such as charging, discharging, and power consumption management by using the power supply management system.

In addition, the mobile terminal 700 includes some functional modules not shown, and details are not described herein again.

It should be noted that in this specification, the term "include", or any other variant thereof is intended to cover non-exclusive inclusion, so that a process, method, article, or apparatus that includes a series of elements includes not only those elements but also other elements that are not explicitly listed, or includes elements inherent to such a process, method, article, or apparatus. In the absence of more restrictions, an element defined by the statement "including a . . . " does not exclude presence of another identical element in a process, method, article, or apparatus that includes the element.

According to the foregoing descriptions of the implementations, a person skilled in the art may clearly understand that the foregoing methods in the embodiments may be implemented by using software and a required universal hardware platform, or certainly may be implemented by using hardware. However, in many cases, the former is a better implementation. Based on such an understanding, the technical solutions of the present disclosure essentially or the part contributing to related technologies may be implemented in a form of a software product. The computer software product is stored in a storage medium (such as a read-only memory (ROM)/random access memory (RAM), a magnetic disk, or an optical disc), and includes several instructions for instructing a terminal (which may be a mobile phone, a computer, a server, an air conditioner, or a network device) to execute the methods described in the embodiments of the present disclosure.

A person skilled in the art can clearly understand that for ease of descriptions, for a specific working process of the system, apparatus, and unit described above, refer to the corresponding process in the foregoing method embodiments. Details are not described herein again.

In the embodiments provided in this application, it should be understood that the disclosed apparatuses and methods may be implemented in other ways. For example, the apparatus embodiments described above are only an example. For example, the division of the units is only logical function division. There may be other division manners in actual implementation, for example, multiple units or components may be combined or integrated into another system, or some features may be ignored or not implemented. In addition, the mutual coupling, direct coupling, or communication connection shown or discussed may be indirect coupling or communication connection through some interfaces, apparatuses, or units, and may be in electrical, mechanical, or other forms.

The units described as separate components may be or may not be physically separated, and the components displayed as units may be or may not be physical units, that is, may be located in one place or distributed on a plurality of network units. Some or all of the units may be selected according to actual needs to achieve the objective of the solutions of the embodiments.

In addition, functional units in each embodiment of the present disclosure may be integrated into one processing unit, or each unit may have separate physical existence, or two or more units may be integrated in one unit.

The embodiments of the present disclosure are described above with reference to the accompanying drawings, but the present disclosure is not limited to the foregoing specific implementations. The foregoing specific implementations are merely illustrative instead of restrictive. Under enlightenment of the present disclosure, a person of ordinary skill in the art may make many forms without departing from the aims of the present disclosure and the protection scope of claims, all of which fall within the protection of the present disclosure.

The invention claimed is:

1. An image sensor, comprising:
a pixel array, wherein the pixel array comprises a preset quantity of pixel units arranged in a predetermined manner, the pixel unit comprises a first pixel and a second pixel adjacent to the first pixel, the first pixel comprises a red subpixel, a green subpixel, and a blue subpixel, the second pixel comprises a red subpixel, a green subpixel, and an infrared subpixel, and both the first pixel and the second pixel are dual photodiode pixels, wherein a location of the blue subpixel in the first pixel is the same as that of the infrared subpixel in the second pixel, and each of the first pixel and the second pixel comprises four dual photodiode subpixels, wherein the red subpixel comprises a semiconductor layer, a metal layer, a photodiode, a red light filter, and a micro lens that are sequentially stacked;

the green subpixel comprises a semiconductor layer, a metal layer, a photodiode, a green light filter, and a micro lens that are sequentially stacked;

the blue subpixel comprises a semiconductor layer, a metal layer, a photodiode, a blue light filter, and a micro lens that are sequentially stacked; and the infrared subpixel comprises a semiconductor layer, a metal layer, a photodiode, an infrared cut-off filter, and a micro lens that are sequentially stacked.

2. The image sensor according to claim 1, wherein the pixel unit comprises one second pixel and at least one first pixel.

3. The image sensor according to claim 1, wherein the image sensor is a complementary metal oxide semiconductor (CMOS) image sensor, a charge coupled device (CCD) image sensor, or a quantum thin-film image sensor.

4. A mobile terminal, comprising an imaging system and an infrared transmitting module, wherein the imaging system comprises an image sensor, and further comprises:
a lens module;
a driver module configured to drive the lens module to move;
a filtering module disposed between the lens module and the image sensor;
an image data processing module connected to the image sensor; and
a display module connected to the image data processing module,
wherein the image sensor comprises a pixel array, wherein the pixel array comprises a preset quantity of pixel units arranged in a predetermined manner, the pixel unit comprises a first pixel and a second pixel adjacent to the first pixel, the first pixel comprises a red subpixel, a green subpixel, and a blue subpixel, the second pixel comprises a red subpixel, a green subpixel, and an infrared subpixel, and both the first pixel and the second pixel are dual photodiode pixels, wherein a location of the blue subpixel in the first pixel is the same as that of the infrared subpixel in the second pixel, and each of the first pixel and the second pixel comprises four dual photodiode subpixels, wherein the red subpixel comprises a semiconductor layer, a metal layer, a photodiode, a red light filter, and a micro lens that are sequentially stacked;

the green subpixel comprises a semiconductor layer, a metal layer, a photodiode, a green light filter, and a micro lens that are sequentially stacked;

the blue subpixel comprises a semiconductor layer, a metal layer, a photodiode, a blue light filter, and a micro lens that are sequentially stacked; and the infrared subpixel comprises a semiconductor layer, a metal layer, a photodiode, an infrared cut-off filter, and a micro lens that are sequentially stacked.

5. The mobile terminal according to claim 4, wherein the filtering module may allow an optical wavelength from 380 nm to 1100 nm to pass through.

6. The mobile terminal according to claim 4, wherein the infrared transmitting module is disposed on the periphery of the lens module.

7. The mobile terminal according to claim 4, wherein the pixel unit comprises one second pixel and at least one first pixel.

8. The mobile terminal according to claim 4, wherein the image sensor is a complementary metal oxide semiconductor (CMOS) image sensor, a charge coupled device (CCD) image sensor, or a quantum thin-film image sensor.

9. A photographing method, applied to a mobile terminal, wherein the mobile terminal comprises the image sensor according to claim 1 and further comprises an infrared transmitting module, and the method comprises:
emitting infrared light by using the infrared transmitting module;
obtaining a distance between each infrared light reflection point of a to-be-photographed object and the mobile terminal according to infrared light reflected by a to-be-photographed object; and
obtaining three-dimensional information of the to-be-photographed object according to the distance between each infrared light reflection point of the to-be-photographed object and the mobile terminal.

10. The photographing method according to claim 9, wherein the step of obtaining a distance between each infrared light reflection point of a to-be-photographed object and the mobile terminal according to infrared light reflected by the to-be-photographed object comprises:
receiving, by using the pixel array comprising the second pixel, infrared light reflected by each infrared light reflection point of the to-be-photographed object; and
obtaining the distance between each infrared light reflection point of the to-be-photographed object and the mobile terminal according to a time difference between sending the infrared light and receiving the infrared light and a propagation speed of the infrared light or an obtained phase difference of the infrared light.

11. The image sensor according to claim 1, wherein the first pixel specifically comprises one red subpixel, two green subpixels and one blue subpixel, and
the second pixel specifically comprises one red subpixel, two green subpixels, and one infrared subpixel.

12. The mobile terminal according to claim 4, wherein the first pixel specifically comprises one red subpixel, two green subpixels and one blue subpixel, and the second pixel specifically comprises one red subpixel, two green subpixels, and one infrared subpixel.

\* \* \* \* \*